United States Patent
Lung et al.

(10) Patent No.: US 8,178,386 B2
(45) Date of Patent: *May 15, 2012

(54) PHASE CHANGE MEMORY CELL ARRAY WITH SELF-CONVERGED BOTTOM ELECTRODE AND METHOD FOR MANUFACTURING

(75) Inventors: Hsiang-Lan Lung, Elmsford, NY (US); Chung Hon Lam, Peekskill, NY (US); Matthew J. Breitwisch, Yorktown Heights, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 342 days.

This patent is subject to a terminal disclaimer.

(21) Appl. No.: 11/855,983

(22) Filed: Sep. 14, 2007

(65) Prior Publication Data
US 2009/0072216 A1    Mar. 19, 2009

(51) Int. Cl.
*H01L 21/06* (2006.01)
(52) U.S. Cl. .......... 438/102; 257/214; 257/E21.068
(58) Field of Classification Search .......... 438/48, 438/57, 93, 95, 239, 243, 244, 253, 386, 438/387, 396, 84, 102, 103; 257/214, 298, 257/2, 42, 309, 565, E29.087, E21.068
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |

(Continued)

FOREIGN PATENT DOCUMENTS

CN    1462478    12/2003

(Continued)

OTHER PUBLICATIONS

Atwood, G, et al., "90nm Phase Change Technology with µ Trench and Lance Cell Elements," VLSI Technology, Systems and Applications, Apr. 23-25, 2007, pp. 1-2.

(Continued)

*Primary Examiner* — William D Coleman
*Assistant Examiner* — Su Kim
(74) *Attorney, Agent, or Firm* — Haynes Beffel & Wolfeld LLP

(57) ABSTRACT

An array of phase change memory cells is manufactured by forming a separation layer over an array of contacts, forming a patterning layer on the separation layer and forming an array of mask openings in the patterning layer using lithographic process. Etch masks are formed within the mask openings by a process that compensates for variation in the size of the mask openings that result from the lithographic process. The etch masks are used to etch through the separation layer to define an array of electrode openings exposing the underlying contacts. Electrode material is deposited within the electrode openings; and memory elements are formed over the bottom electrodes. Finally, bit lines are formed over the memory elements to complete the memory cells. In the resulting memory array, the critical dimension of the top surface of bottom electrode varies less than the width of the memory elements in the mask openings.

11 Claims, 13 Drawing Sheets

U.S. PATENT DOCUMENTS

| | | |
|---|---|---|
| 5,166,758 A | 11/1992 | Ovshinsky et al. |
| 5,177,567 A | 1/1993 | Klersy et al. |
| 5,332,923 A | 7/1994 | Takeuchi |
| 5,389,566 A | 2/1995 | Lage |
| 5,391,901 A | 2/1995 | Tanabe et al. |
| 5,515,488 A | 5/1996 | Hoppe et al. |
| 5,534,712 A | 7/1996 | Ovshinsky et al. |
| 5,550,396 A | 8/1996 | Tsutsumi et al. |
| 5,687,112 A | 11/1997 | Ovshinsky |
| 5,751,012 A | 5/1998 | Wolstenholme et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,316,348 B1 | 11/2001 | Fu et al. |
| 6,320,786 B1 | 11/2001 | Chang et al. |
| 6,337,266 B1 * | 1/2002 | Zahorik ............... 438/618 |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,507,061 B1 | 1/2003 | Hudgens et al. |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,858 B1 | 4/2003 | Jones et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,746,892 B2 | 6/2004 | Lee et al. |
| 6,750,079 B2 | 6/2004 | Lowrey et al. |
| 6,791,102 B2 | 9/2004 | Johnson et al. |
| 6,791,859 B2 | 9/2004 | Hush et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi et al. |
| 6,808,991 B1 | 10/2004 | Tung et al. |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,992,932 B2 | 1/2006 | Cohen et al. |
| 7,018,911 B2 | 3/2006 | Lee et al. |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,164,147 B2 | 1/2007 | Lee et al. |
| 7,166,533 B2 | 1/2007 | Happ |
| 7,169,635 B2 | 1/2007 | Kozicki |
| 7,214,958 B2 | 5/2007 | Happ |
| 7,220,983 B2 | 5/2007 | Lung |
| 7,277,317 B2 | 10/2007 | Le Phan et al. |
| 7,291,556 B2 * | 11/2007 | Choi et al. .................... 438/672 |
| 7,323,708 B2 | 1/2008 | Lee et al. |
| 7,351,648 B2 | 4/2008 | Furukawa et al. |
| 7,365,385 B2 | 4/2008 | Abbott |
| 7,394,089 B2 | 7/2008 | Doyle et al. |
| 7,463,512 B2 * | 12/2008 | Lung ........................... 365/163 |
| 7,473,576 B2 * | 1/2009 | Lung ........................... 438/102 |
| 7,485,891 B2 | 2/2009 | Hamann et al. |

| | | |
|---|---|---|
| 7,504,653 B2 | 3/2009 | Lung |
| 7,579,613 B2 | 8/2009 | Lung et al. |
| 7,606,059 B2 | 10/2009 | Toda |
| 7,623,370 B2 | 11/2009 | Toda et al. |
| 7,642,125 B2 * | 1/2010 | Lung et al. ............... 438/102 |
| 7,778,063 B2 | 8/2010 | Brubaker et al. |
| 2002/0042158 A1 | 4/2002 | Kersch et al. |
| 2002/0070457 A1 | 6/2002 | Sun et al. |
| 2002/0113273 A1 | 8/2002 | Hwang et al. |
| 2002/0182835 A1 | 12/2002 | Quinn |
| 2003/0003647 A1 | 1/2003 | Dennison et al. |
| 2003/0215978 A1 | 11/2003 | Maimon et al. |
| 2004/0051094 A1 | 3/2004 | Ooishi |
| 2004/0114317 A1 * | 6/2004 | Chiang et al. ............ 361/683 |
| 2004/0165422 A1 | 8/2004 | Hideki et al. |
| 2005/0018526 A1 | 1/2005 | Lee |
| 2005/0019975 A1 | 1/2005 | Lee et al. |
| 2005/0029502 A1 | 2/2005 | Hudgens |
| 2005/0062087 A1 | 3/2005 | Chen et al. |
| 2005/0093022 A1 | 5/2005 | Lung |
| 2005/0127347 A1 | 6/2005 | Choi et al. |
| 2005/0130414 A1 | 6/2005 | Choi et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2006/0001174 A1 | 1/2006 | Matsui |
| 2006/0003263 A1 | 1/2006 | Chang |
| 2006/0038221 A1 | 2/2006 | Lee et al. |
| 2006/0073642 A1 | 4/2006 | Yeh et al. |
| 2006/0077741 A1 | 4/2006 | Wang et al. |
| 2006/0091476 A1 | 5/2006 | Pinnow et al. |
| 2006/0108667 A1 | 5/2006 | Lung |
| 2006/0110878 A1 | 5/2006 | Lung et al. |
| 2006/0110888 A1 * | 5/2006 | Cho et al. ............... 438/385 |
| 2006/0118913 A1 | 6/2006 | Yi et al. |
| 2006/0154185 A1 | 7/2006 | Ho et al. |
| 2006/0175596 A1 | 8/2006 | Happ et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0261392 A1 * | 11/2006 | Lee et al. ............... 257/296 |
| 2006/0281216 A1 | 12/2006 | Chang et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1 | 1/2007 | Fan et al. |
| 2007/0030721 A1 | 2/2007 | Segal et al. |
| 2007/0037101 A1 | 2/2007 | Morioka |
| 2007/0045605 A1 | 3/2007 | Hsueh |
| 2007/0045606 A1 | 3/2007 | Magistretti et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0224726 A1 | 9/2007 | Chen et al. |
| 2007/0235811 A1 | 10/2007 | Furukawa et al. |
| 2007/0246699 A1 | 10/2007 | Lung |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0014676 A1 | 1/2008 | Lung et al. |
| 2008/0079091 A1 * | 4/2008 | Park et al. ............... 257/390 |
| 2008/0116441 A1 | 5/2008 | Raghuram et al. |
| 2008/0164453 A1 * | 7/2008 | Breitwisch et al. ........... 257/3 |
| 2009/0298223 A1 | 12/2009 | Cheek et al. |
| 2010/0193763 A1 | 8/2010 | Chen et al. |
| 2010/0291747 A1 | 11/2010 | Lung et al. |
| 2011/0034003 A1 | 2/2011 | Lung |

FOREIGN PATENT DOCUMENTS

| | | |
|---|---|---|
| WO | WO-00/79539 | 12/2000 |
| WO | WO-01/45108 | 6/2001 |

OTHER PUBLICATIONS

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4 pp.

"Remembering on the Cheap," www.sciencenews.org <http://www.sciencenews.org>, Mar. 19, 2005, p. 189, vol. 167.

"Thermal Conductivity of Crystalline Dielectrics" in CRC Handbook of Chemistry and Physics, Internet Version 2007, (87$^{th}$ edition), David R. Lide, ed. Taylor and Francis, Boca Raton, FL.

Adler, D. et al., "Threshold Switching in Chalgenid-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "Highly Reliable 5nm Contact Cell Technology for 256Mb PRAM," VLSI Technology, Digest of Technical Papers, Jun. 14-16, 2005, pp. 98-99.

Ahn, S.J. et al., "A Highly Manufacturable High Density Phase Change Memory og 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000 121 pages.

Chen, et al., "Non-Volatile Resistive Switching for Advanced Memory Applications," IEEE IEDM, Dec. 5-7 2005, 4 pp.

Cho, S.L. et al., "Highly Scalable On-axis Confined Cell Structure for High Density PRAM beyond 256Mb," 2005 Symposium on VLSI Technology Digest of Technical Papers, pp. 96-97.

Chao, D-S. et al., "Low Programming Current Phase Change Memory Cell with Double gst Thermally Confined Structure," VLSI-TSA 2007, International symposium Apr. 23-25, 2007, 2pp.

Gibson, G.A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y.H. et al., "An Edge Contact Type Cell from Phase Change RAM Featuring Very Low Power Consumtion," 2003 Symposium on VSLI Technology Digest of Technical Papers, pp. 175-176.

Happ, T.D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-Change RAM Based on 0.24μm-CMOS Technologies," 2003 Symposium on VLSI Technology Digest of Technical Papers, pp. 173-174.

Iwasaki, Hiroko et al, "completely Erasable Phase Change Optical Disk," Jpn. J. Appl. Phys., Feb. 1992, pp. 461-465, vol. 31.

Jeong, C.W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43$^{rd}$ Annual International Reliability Physics Symposium, San Jose, 2005, pp. 157-162.

Kojima, Rie et al., "Ge—Sn—Sb—Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002.

Schrafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFTs for Vertical Intergration Applications," IEEE Electron Device Letters, vol. 20, No. 7, Jul. 1999.

Wicker, Guy et al., Nonvolatile, High Density, High Performance Phase Change Memory, 1999, 'http://klabs.org/richcontent/MAPLDCon99/Papers/P21_Tyson_P.PDF#search=nonvolatile%20 high%20density%20high%20performance%20phase%20change%20memory <http://klabs.org/richcontent/MAPLDCon99/Papers/P21_Tyson_P.PDF#search='nonvolatile%20high%20density%20high%20performance%20phase%20change%20memory>', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

PHASE CHANGE MEMORY CELL ARRAY WITH SELF-CONVERGED BOTTOM ELECTRODE AND METHOD FOR MANUFACTURING

International Business Machines Corporation, a New York corporation; Macronix International Corporation, Ltd., a Taiwan corporation, and Infineon Technologies A.G., a German corporation, are parties to a Joint Research Agreement.

BACKGROUND

1. Field of the Invention

The present disclosure relates to high density memory devices based on programmable resistive materials, including phase change materials like chalcogenides, and to methods for manufacturing such devices.

2. Description of Related Art

Programmable resistive materials, including phase change based materials, have been used in nonvolatile random access memory cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material may be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from a crystalline state to an amorphous state. The magnitude of the needed reset current can be reduced by reducing the volume of the active region in the phase change material element in the cell. Techniques used to reduce the volume of the active region include reducing the contact area between electrodes and the phase change material, so that higher current densities are achieved in the active volume, with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued 11 Nov. 1997; Zahorik et al., "Method of Making Chalogenide [sic] Memory Device," U.S. Pat. No. 5,789,277, issued 4 Aug. 1998; Doan et al., "Controllable Ovonic Phase-Change Semiconductor Memory Device and Methods of Fabricating the Same," U.S. Pat. No. 6,150,253, issued 21 Nov. 2000.

Another memory cell structure under development, referred to sometimes as a "mushroom" cell because of the shape of the active region on the bottom electrode in a typical structure, is based on the formation of a small electrode in contact with a larger portion of phase change material, and then a usually larger electrode in contact with an opposite surface of the phase change material. Current flow from the small contact to the larger contact is used for reading, setting and resetting the memory cell. The small electrode concentrates the current density at the contact point, so that an active region in the phase change material is confined to a small volume near the contact point. See, for example, Ahn et al., "Highly reliable 50 nm contact cell technology for 256 Mb PRAM," VLSI Technology 2005 Digest of Technical Papers, pages 98-99, 14 Jun. 2005; Denison, International publication No. WO2004/055916 A2, "Phase Change Memory and Method Therefore," Publication Date: 1 Jul. 2004; and Song et al., United States Patent Application Publication No. US 2005/0263829 A1, "Semiconductor Devices Having Phase Change Memory Cells, Electronic Systems Employing the Same and Methods of Fabricating the Same," published 1 Dec. 2005.

One prior art technique for making very small bottom electrodes, as described in the Ahn et al. publication, is referred to herein as a plug-in-via process, and includes forming a dielectric fill layer over circuitry for accessing the memory cell, etching vias in the dielectric fill layer to form an opening for making contact with the circuitry, and depositing electrode material into the via. The resulting structure is then planarized to expose the electrode material within the via. The phase change material is deposited and patterned in contact with the electrode. Although this technique is suitable for forming very small bottom electrode structures using a plug-in-via process, it has proved to suffer reliability and yield issues. For example, as described by Ahn et al., it has proven difficult to form reliable contact with the underlying access circuitry at the bottom of very small vias. This results in some cells in the array being permanently disconnected from the access circuits. See also, Horii, et al. "A Novel so Technology Using N-doped GeSbTe Films for Phase Change RAM," 2003 Symposium on VLSI Technology, Digest of Technical Papers; Hwang, et al., "Full Integration and Reliability Evaluation of Phase-Change RAM Based on 0.24 um-CMOS Technologies," 2003 Symposium on VLSI Technology, Digest of Technical Papers; Lai, et al., "OUM-180 nm Nonvolatile Memory Cell Element Technology for Stand Alone and Embedded Applications," IEDM, 2001.

Furthermore, Ahn et al. have related that it is difficult to ensure in the plug-in-via process that the areas of the exposed tops of the plug electrodes are uniform after the planarizing step across a large array of such cells. Since the area of the top surface of the bottom electrode affects current density in the phase change material, and is a critical dimension for phase change cells of this type, variations in the contact area results in significant variations in operation of the cells in a single array.

Yet another problem arises in the formation of plug-in via electrodes, because of the difficulty of uniformly filling vias. In particular, due to the dynamics of thin film deposition within small holes, the plug that results may include a void where the top of the via closes off before it has been completely filled below. Planarizing the structure may open the void, and create a hole in the top surface of the electrode plug. Such holes cause problems in the successful formation of a layer of phase change material over the electrode.

Another technology for making mushroom-type memory cells with pillar shaped bottom electrodes is described in our co-pending U.S. patent application Ser. No. 11/764,678 filed on 18 Jun. 2007 (PCM-0110; MXIC 1791-2).

Furthermore, the vias in the approach of Ahn et al. are made using lithographic processes which have characteristic minimum feature sizes, and typically result in vias that vary in diameter by as much as 5% of the minimum feature size. In some approaches, sidewalls are formed within the vias to reduce the cross-sectional area of the via used for electrode formation, reducing a critical dimension for the memory cell. The sidewall formation process involves conformal deposition of the sidewall material, having a uniform thickness around the walls of the via, and thus carrying the variation in size of the via into the critical dimension itself.

Likewise, the pillars in the approach of U.S. patent application Ser. No. 11/764,678 are made by patterning photoresist using a lithographic process, and then trimming the photoresist elements in the pattern to reduce their dimensions below the minimum lithographic feature size. The trimmed photoresist element is used as an etch mask for formation of the bottom electrode and defines a critical dimension of the memory cell. This process also carries the variation in the minimum feature size of the photoresist elements into the critical dimension of the cell. Thus, for a lithographic minimum feature size of about 90 nm, which has a distribution of 5% across an array, the via diameters could vary as much as 4.5 nm. This 4.5 nm variation is carried according to the prior art techniques into the sub-lithographic feature size. So a bottom electrode surface having a nominal diameter of 30 nm formed using the prior art techniques will vary in diameter across the array by as much as 4.5 nm, resulting in variation of the critical contact area of about 30% for a circular surface. This variation in the critical dimension of a programmable resistive memory cell reduces yield and complicates the technology for programming and reading the data in the cells.

It is desirable therefore to provide a reliable method for manufacturing a memory cell structure with self-converging control over the critical dimensions of the bottom electrode and over the electrical integrity of connections to the bottom electrode, which will work with high density integrated circuit memory devices.

SUMMARY

A phase change memory device based on a "mushroom" type structure is described in which the critical dimension of the area of contact between the memory element and the bottom electrode converges within a small range across the array independent of the variations caused by lithographic processes, or other patterning processes, involved in manufacturing the device.

A manufacturing process for implementing the memory cell includes providing a substrate having an array of contacts where the contacts are coupled with access circuitry in the substrate. A separation layer is formed over the array of contacts, acting to separate the substrate from memory elements. The separation layer may comprise an etch stop material such as silicon nitride in a representative embodiment. Next, a patterning layer using a material such as silicon dioxide or similar material chosen for etching characteristics that differ from those of the separation layer is formed over the separation layer. An array of mask openings is formed in the patterning layer using a lithographic process. The mask openings are formed using a process which stops at the surface of or within the separation layer. Next, etch masks are formed within the mask openings in the array using a process that compensates for variations in the diameters or widths of mask openings in the array of mask openings which result from the lithographic process. The etch masks are used during an etching process for forming bottom electrode openings in the separation layer which are self aligned with the mask openings. Electrode material is deposited into the electrode openings to form an array of bottom electrodes contacting corresponding contacts in the array of contacts. Memory elements, comprising programmable resistive material such as the phase change material, are formed over the array of bottom electrodes after removal of the patterning layer and etch masks in illustrated embodiments. Top electrodes are formed in contact with the memory elements.

Techniques are described for forming the etch masks using a process that compensates for variations in the array of mask openings. One technique includes forming a sacrificial layer over the patterning layer, and wherein the process of forming the mask openings includes forming first upper opening segments within the sacrificial layer and second lower opening segments within the patterning layer. The first and second opening segments are formed so that they have first and second widths so that the sacrificial layer has an overhanging portion extending into the openings. Thus, the width of the opening in the sacrificial layer is less than the width of the opening in the patterning layer. A fill material, such as silicon, is deposited within the openings by a process causing formation of voids within the lower opening segments having width determined by the difference between the first and second widths. The fill material is anisotropically etched to open the voids, and then through the fill material at the bottom of the voids to expose the separation layer. In this manner, the exposed areas have widths substantially equal to the widths of the voids. The sidewalls of fill material on the sides of the lower opening segments define the etch masks. In this manner, the variation in the size of the openings defined by the etch masks depends on the dimension of the overhang, caused by the difference between the first and second widths. This dimension is independent of, and can be controlled over a range much less than, the variation in the size of the mask openings, and the variation in size of other features, such as the width of the memory elements, caused by the lithographic process.

In one alternative process described, the process includes removing the etch masks from within the array of mask openings after formation of the bottom electrode openings. Electrode material is deposited within the electrode openings and over the array of mask openings. The electrode material is anisotropically etched leaving side walls of electrode material within the mask openings and the bottom electrodes within the electrode openings. The resulting openings are filled using a spin coating process, for example, and then the patterning layer is removed using chemical mechanical polishing, exposing the array of bottom electrodes in the separation layer. In another alternative process, the electrode material is deposited within the electrode openings before removing the etch masks, substantially filling the mask openings. A chemical mechanical polishing step is applied, exposing the array of bottom electrodes in the separation layer.

Programmable resistance material is deposited over the bottom electrodes. Top electrode structures are formed, including the bit lines over the programmable resistance material.

A memory device is described herein comprising a substrate including an array of access devices having a corresponding array of contacts and a plurality of word lines coupled to the array of access devices. A separation layer overlies the substrate and the array of word lines. An array of bottom electrodes comprises pillars of electrode material through the separation layer contacting corresponding contacts in the array of contacts. An array of memory elements comprising programmable resistive material overlies and contacts the bottom electrodes. A plurality of bit lines in electrical communication with a programmable resistive material in the memory elements provides a current path from the bottom electrodes through corresponding elements of programmable resistive material to peripheral circuitry. As described herein, the memory elements in the array have respective widths that vary within a distribution that is determined by the lithographic process, or other patterning process, used to form them. The bottom electrodes in the array of bottom electrodes have widths that vary within another distribution that is independent of the patterning process used to form the memory elements. The range of widths for bottom electrodes has an extent of less than 3 nm in embodiments of the technology described here, much less than possible using lithographic technologies. Thus, the width of a particular memory element in the array differs from the width of at least one other memory element in the array by as much as 5% to 10% of the width of the particular memory element. In contrast, the width of the top surface of the bottom electrode in contact with the particular memory element differs from the width of the top surface of the bottom electrode of the at least one other memory element by substantially less than said 5% to 10% of the width of the particular via.

Other aspects and advantages of the technology described herein can be understood with reference to the figures, the detailed description and the claims which follow.

DETAILED DESCRIPTION

Embodiments of the present invention are described with reference to FIGS. 1-20.

Figure 1:
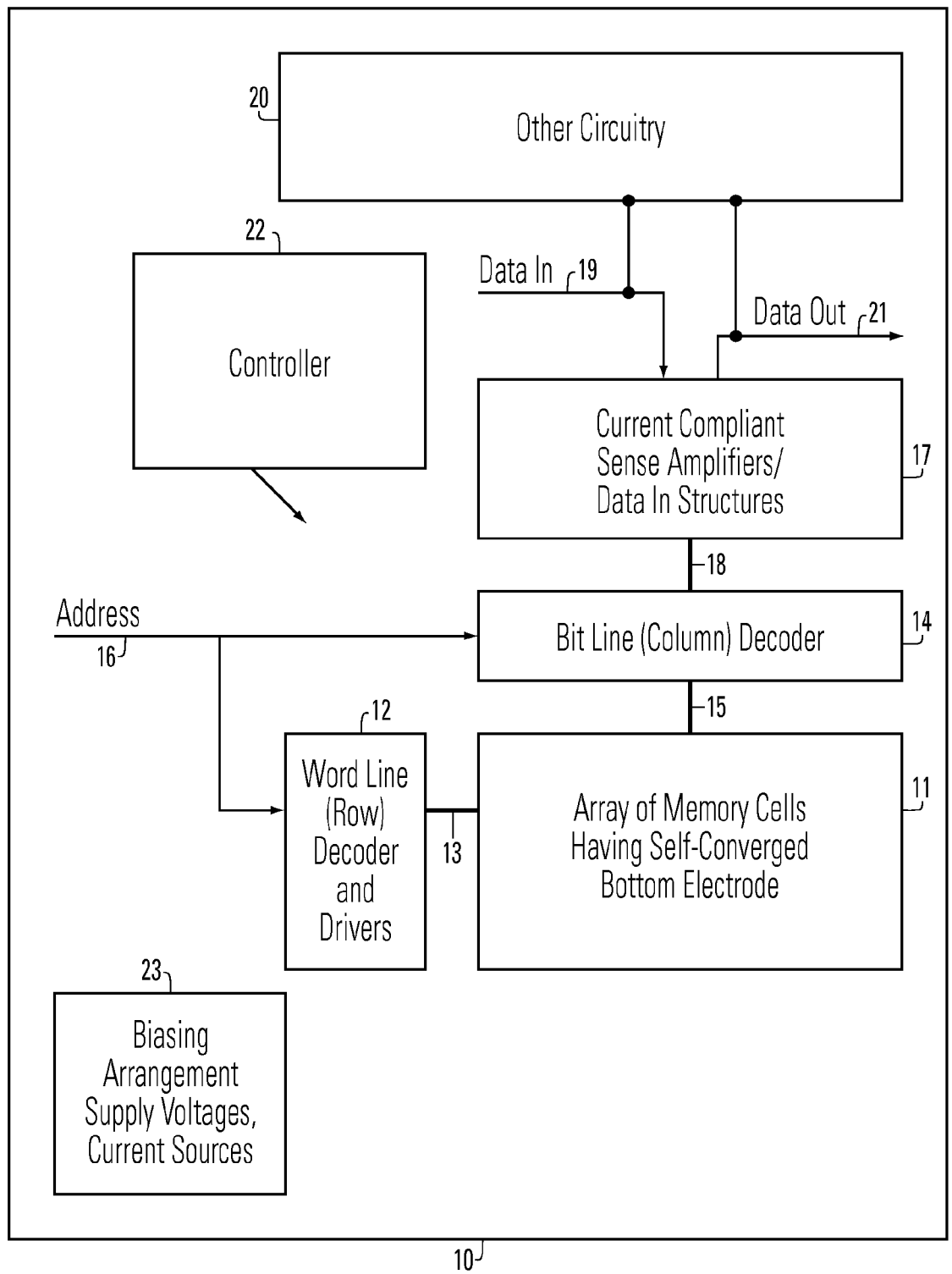
FIG. 1 is a block diagram of an integrated circuit device in accordance with an embodiment of the disclosure.

FIG. 1 is a simplified block diagram of an integrated circuit 10 including a memory array 11 implemented using phase change memory cells as described herein having bottom electrodes with self-converged critical dimensions. A word line (or row) decoder 12 is coupled to, and in electrical communication with, a plurality of word lines 13, and arranged along rows in the memory array 11. A bit line (column) decoder 14 is coupled to and in electrical communication with a plurality of bit lines 15 arranged along columns in the memory array 11 for reading data from, and writing data to, the phase change memory cells in the memory array 11. Addresses are supplied on bus 16 to the word line decoder 12 and the bit line decoder 14. Sense amplifiers and data-in structures in block 17, including current sources for the read, set and reset modes, are coupled to the bit line decoder 14 via data bus 18. Data is supplied via the data-in line 19 from input/output ports on the integrated circuit 10 or from other data sources internal or external to the integrated circuit 10, to the data-in structures in block 17. In the illustrated embodiment, other circuitry 20 is included on the integrated circuit 10, such as a general purpose processor, special purpose application circuitry, or a combination of modules providing system-on-a-chip functionality supported by the phase change memory cell array. Data is supplied via the data-out line 21 from the sense amplifiers in block 17 to input/output ports on the integrated circuit 10, or to other data destinations internal or external to the integrated circuit 10.

A controller 22 implemented for example using a state machine, controls the application of bias arrangement supply voltages and current sources 23, such as read, program erase, erase verify, program verify voltages or currents for the word lines and bit lines, and controls the word line/source line operation using an access control process. The controller 22 can be implemented using special purpose logic circuitry as known in the art. In alternative embodiments, the controller 22 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 22.

Figure 2:
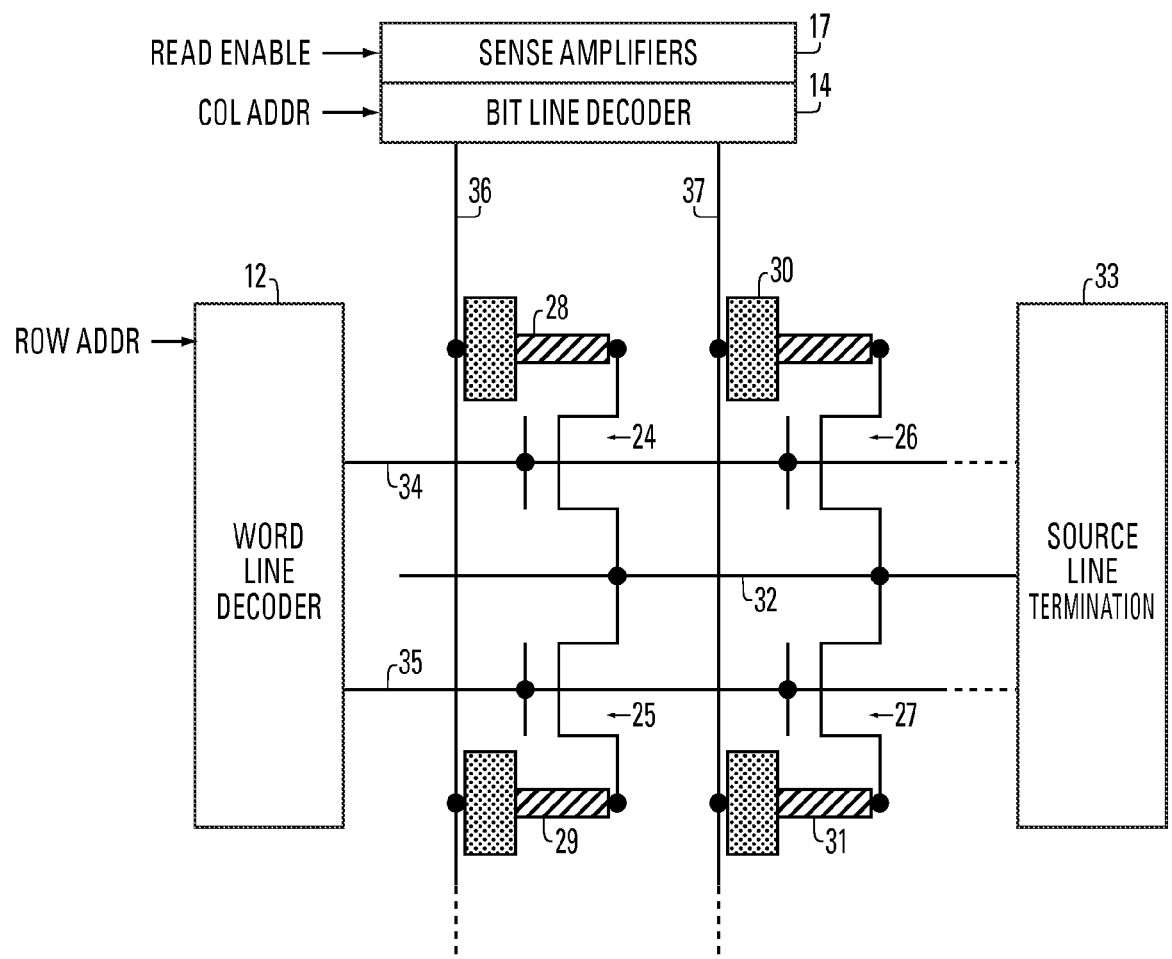
FIG. 2 is a partial schematic of a representative memory array as shown in FIG. 1.

As shown in FIG. 2, each of the memory cells of array 11 includes an access transistor (or other access device such as a diode), four of which are shown as 24, 25, 26, 27 and phase change elements 28, 29, 30, and 31. Sources of each of access transistors 24, 25, 26 and 27 are connected in common to a source line 32 that terminates in a source line termination 33. In another embodiment the source lines of the select devices are not electrically connected, but are independently controllable. A plurality of word lines 13 including word lines 34 and 35 extend parallel along a first direction. The word lines 34 and 35 are in electrical communication with the word line decoder 12. The gates of access transistors 24 and 26 are connected to a common word line, such as the word line 34, and the gates of access transistors 25 and 27 are connected in common to the word line 35. A plurality of bit lines 15 including bit lines 36 and 37 are shown. The phase change element 28 is connected between the drain of access transistor 24 and the bit line 36, and the phase change element 29 is connected between the drain of access transistor 25 and the bit line 36. Similarly, the phase change element 30 is connected between the drain of access transistor 26 and the bit line 37, and the phase change element 31 is connected between the drain of access transistor 27 and the bit line 37. It should be noted that four memory cells are shown for convenience of discussion but, in practice, array 11 may comprise thousands to millions of such memory cells. Also, other array structures may be used.

Figure 3A:
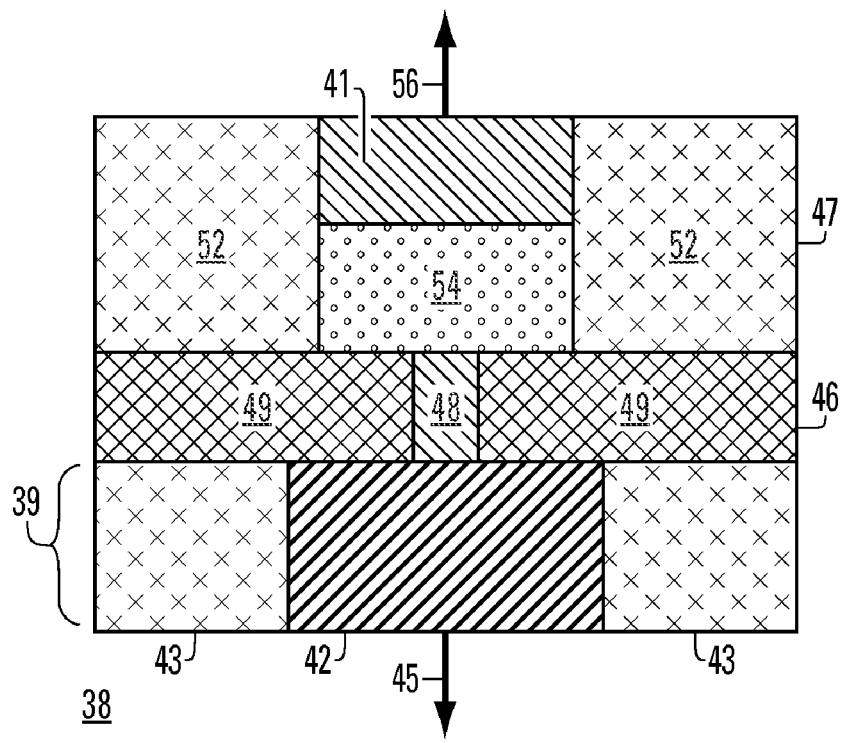
FIG. 3A illustrates a cross-sectional view of a memory cell in accordance with an embodiment of the disclosure.

FIG. 3A illustrates a cross-sectional view of a memory cell structure 38 with a self-converged critical dimension for the bottom electrode according to one embodiment. The memory cell structure 38 is formed on a substrate 39 including an array of contacts, such as contact 42 in an interlayer dielectric 43. A separation layer 46 comprising dielectric material 49 with an array of bottom electrodes, including electrode 48, separates the array of contacts from overlying memory elements 54. The array of bottom electrodes is aligned with the array of contacts, such that the bottom electrode 48 is electrically connected to the contact 42. The contact 42 has a bottom surface that connects to an access device 45, such as a transistor or diode controlled by a word line, for coupling to a reference line. An array of phase change memory elements, including element 54, overlies the separation layer 46, in alignment with the array of bottom electrodes. A top electrode structure 41, overlies the array of memory elements, and contacts the programmable resistance material in the memory elements 54. The top electrode structure 41 is coupled to or includes a bit line, coupled to column select circuits 56 and so on as known in the art to complete the array.

Embodiments of memory cell include phase change based memory materials, including chalcogenide based materials and other materials, for memory element 54. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as TeaGebSb100-(a+b), where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include Ge2Sb2Te5, GeSb2Te4 and GeSb4Te7. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state. A program pulse has a magnitude sufficient to raise the temperature of the active region above a solid phase transition temperature, without melting. Appropriate profiles for pulses can be determined empirically, without undue experimentation, specifically adapted to a particular phase change material and device structure.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N—, Si—, Ti—, or other element doping may also be used. These materials can be formed by PVD sputtering or magnetron-sputtering with reactive gases of Ar, $N_2$, and/or He, etc. and chalcogenide at the pressure of 1 mtorr~100 mtorr. The deposition is usually done at room temperature. The collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously.

The post deposition annealing treatment with vacuum or N2 ambient is sometimes needed to improve the crystallized state of chalcogenide material. The annealing temperature typically ranges 100° C. to 400° C. with an anneal time of less than 30 minutes.

The thickness of the chalcogenide material depends on the design of the cell structure. In general, a chalcogenide material with thickness of higher than 8 nm can have a phase change characterization such that the material exhibits at least two stable resistance states, although thinner layers may be suitable for some embodiments.

For memory cells implemented using GST or similar chalcogenides, suitable materials for implementing the top and bottom electrodes in the illustrated embodiment include TiN, TaN, W and doped Si. Alternatively, the electrodes are TiAlN or TaAlN, or comprise, for further examples, one or more elements selected from the group consisting of Ti, W, Mo, Al, Ta, Cu, Pt, Ir, La, Ni, and Ru and alloys thereof.

Figure 3B:
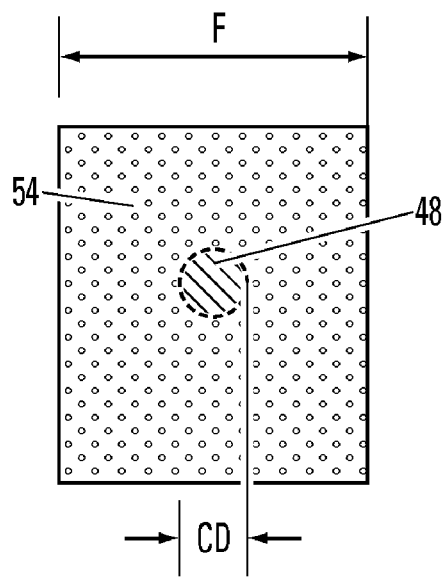
FIG. 3B illustrates a plan view of the memory element and bottom electrode for a memory cell as shown in FIG. 3A.

FIG. 3B illustrates a simplified plan view of the memory cell structure 38 with the self-converged bottom electrode 48 according to one embodiment. The programmable resistance material forming the memory element 54 and the top surface area of the bottom electrode 48 are shown. The top surface area of the bottom electrode 48 is represented in dashed lines to indicate that the bottom electrode 48 is positioned below the phase change material memory element 54. As illustrated the memory element 54 is rectangular, and has a width equal to F, which is preferably the minimum feature size for a lithographic process used to form the memory element 54. The bottom electrode 48 is pillar shaped, and has a circular top surface in this illustration that has a diameter (also referred to a width) equal to CD, which is a critical dimension for the memory cell.

The dimension F varies over a range ΔF dependent on the lithographic and etching processes used to form the memory cell. The dimension CD is formed using a process that compensates for the variation in F, and therefore varies over a range that is substantially less than ΔF. The process that compensates for the variation in F causes self-convergence of the critical dimension CD to a small range ΔCD, improving the uniformity of operation of the array of memory cells, improving yield and simplifying the sensing and programming circuitry needed.

Figure 4:
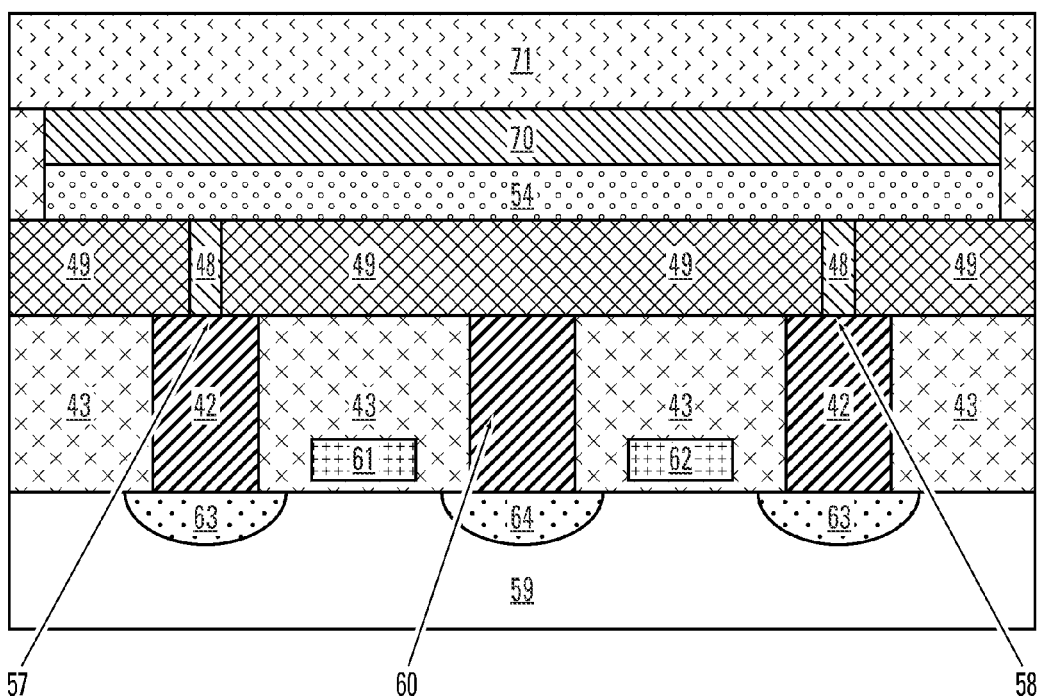
FIG. 4 illustrates a cross-sectional view of a portion of an array of memory cells in accordance with an embodiment, showing a semiconductor substrate including access circuits.

FIG. 4 is a cross-sectional view of a portion of an array of memory cells 57, 58 in accordance with an embodiment, illustrating access circuitry in a semiconductor substrate 59 coupled to an array of contacts 42 in the interlayer dielectric 43. Word lines 61, 62, and a source line 60 are formed within the interlayer dielectric 43. Doped regions 63, 64 in the semiconductor substrate 59 act as terminals of access transistors. Word lines 61, 62 over gate dielectrics act as gates for the access transistors, for coupling the contacts 42 to the common source line 60. In other embodiments the access circuits may be made using diodes instead of transistors, eliminating the need for word lines. A memory element 54 in this embodiment serves as the programmable element in two memory cells 57 and 58. A layer of electrode material 70 overlies the memory element 54, and is in turn coupled to bit line 71.

A first method for manufacturing a memory cell as described herein is illustrated in FIGS. 5-15, showing structures of a single cell at various stages of the method, omitting the access circuits in the substrate for simplicity.

Figure 5:
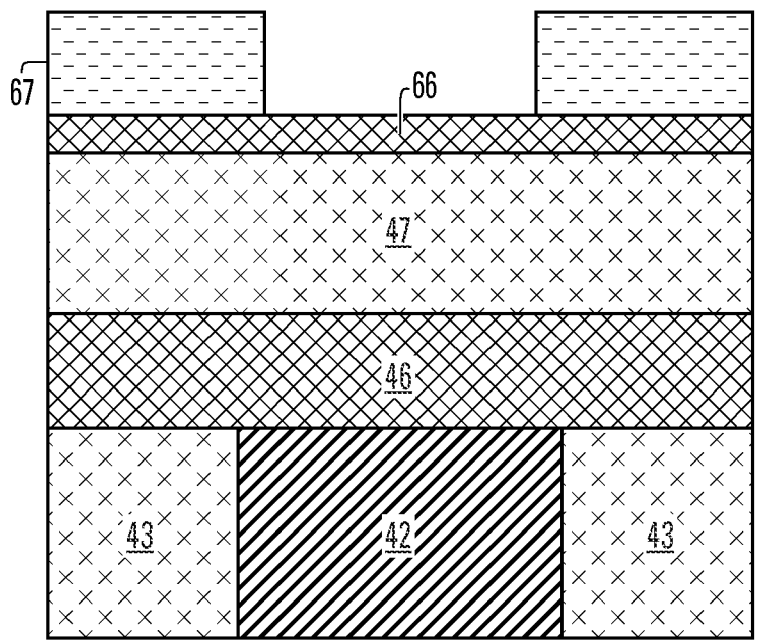
FIGS. 5-13 illustrate stages in a fabrication sequence for an array of programmable resistance memory cells.

FIG. 5 illustrates a structure formed in a first stage of the manufacturing process, including deposition of the separation layer 46 of dielectric material, a patterning layer 47 of dielectric material, and a sacrificial upper layer 66 of dielectric material. In this embodiment, the sacrificial upper layer and the separation layer comprise silicon nitride, and the patterning layer comprises silicon dioxide. The materials of the layers are chosen for the ability to selectively etch as described below. Also, a lithographic process is used to form a mask 67 to define an array of openings over the contacts 42.

Figure 6:
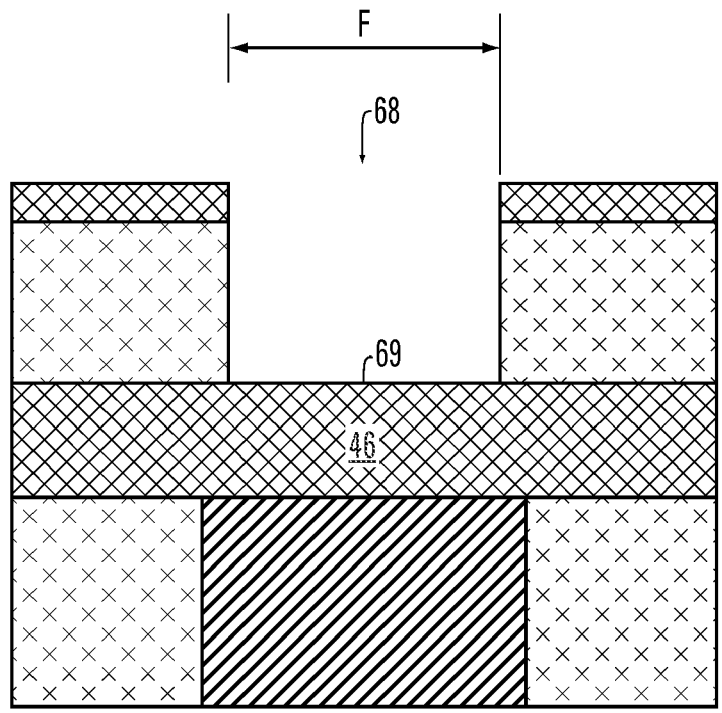

FIG. 6 illustrates a next stage in the process, in which via 68 is formed on the structure 65 using the mask 67. The via 68 is formed by first etching through the sacrificial layer 66 using an etch chemistry suitable for the material of the sacrificial layer, forming an upper opening segment. Then a second etching step, or a continuation of the first etching step if the etch processes can be shared, is used to etch through the patterning layer 47, stopping on or within the separation layer 46 before reaching the contact 42. The via 68 extends through the sacrificial layer 66 and the patterning layer 52, exposing a top surface of the separation layer.

It is preferred that the width or diameter of via 68 be close to the minimum feature size of the process used, typically a minimum lithographic feature size, to create the opening. Using conventional lithographic techniques, the width or diameter of via 68 can be about 90 nm and will typically vary about 5% to 10%, which is about 4.5 nm to about 9 nm.

Figure 7:
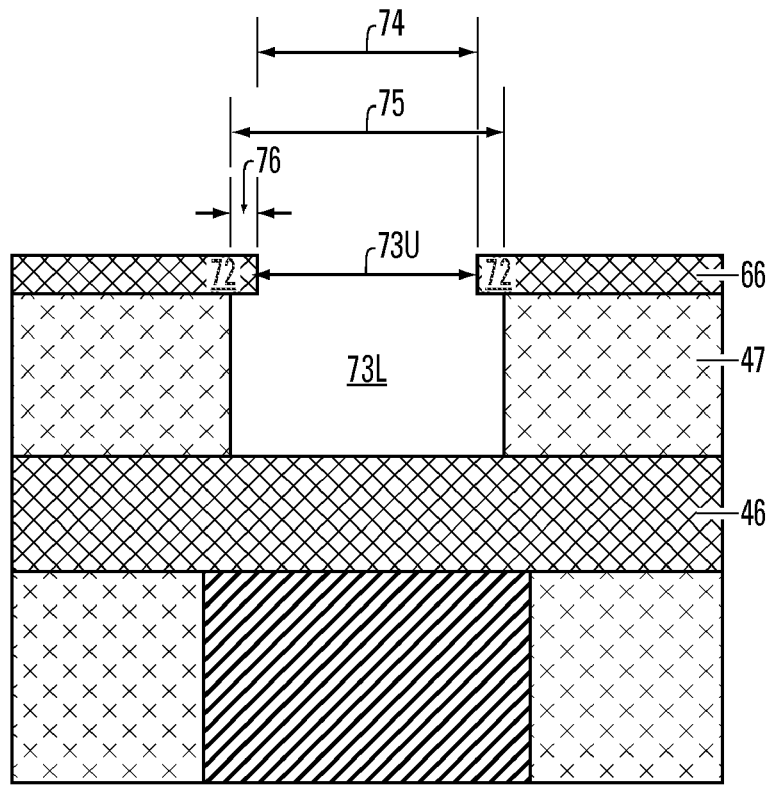

FIG. 7 illustrates a next stage in the process, in which the via 68 is subjected to a selective, undercutting etching process, such as applying dilute HF solution to slowly remove silicon dioxide in the patterning layer while leaving the silicon nitride sacrificial layer 66 and separation layer 46 intact. The via 68 then includes an upper opening segment 73U having a first width 74 and a lower opening segment 73L having a second width 75. The size of overhang portion 72 is equal to the half the difference between the widths 74 and 75, termed an overhang dimension 76. The overhang dimension 76 is determined by the selective etch process and can be very uniform across an array, and is not significantly affected by variations in the dimension F. (See discussion below referring to FIGS. 19 and 20.)

In an alternative process, the upper sacrificial layer comprises a material which can be selectively expanded to create the overhang. For example, using polysilicon for the upper sacrificial layer, oxidation of the structure of FIG. 6 causes the overhang portion 72 while not effectively increasing the volume of the patterning layer 47 or the separation layer 46.

Figure 8:
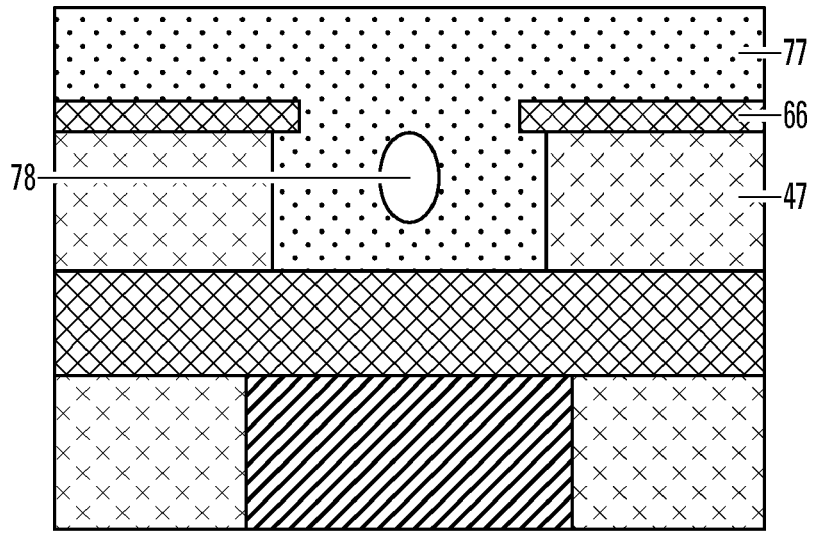

FIG. 8 shows a result of chemical vapor deposition of a fill material 77, such a amorphous silicon or other materials using a process that grows the fill material at a substantially equal rate on the walls of the upper and lower opening segments 73U and 73L, resulting in the formation of a void 78 when the top of the opening closes before the interior is filled. Other materials chosen for their etch chemistry and the ability to grow conformal layers within high aspect ratio vias could also be used as the fill material 77. Also, other procedures, such as atomic layer deposition, physical vapor deposition, low-pressure chemical vapor deposition (LPCVD) of high density plasma chemical vapor deposition (HDPCVD) could be used to deposit the fill material 77, depending on the materials and geometries involved.

The fill deposition creates a self aligned void 78 within the fill material 77 in the lower opening segment 73L. The lateral size or width of the void 78 is primarily controlled by the overhang dimension 76 and by variations in the deposition rates within the lower and upper opening segments 73L, 73U, independent of the lithographic process used to form the openings.

Figure 9:
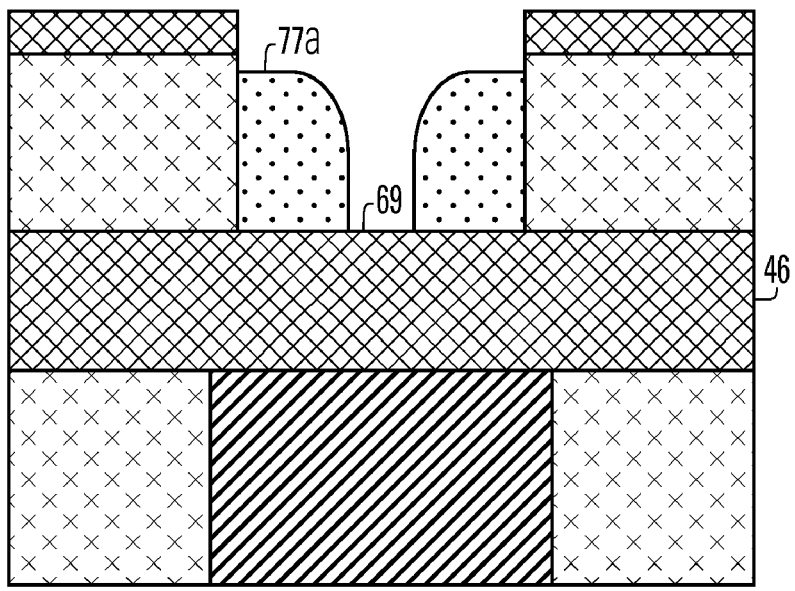
Figure 10:
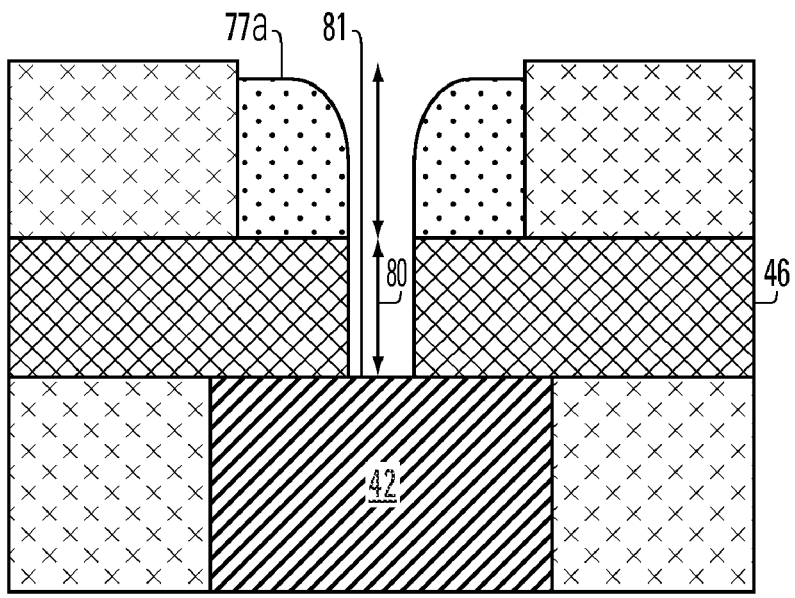

FIG. 9 shows the structure after using an anisotropic etching process etching through the fill material 77 to open the void, and then continuing to etch until the separation layer is exposed in the region 69 below the void to form side wall spacer which acts as an etch mask 77a on the sides of the via. The etch mask 77a has an opening dimension substantially determined by the dimensions of the void. The anisotropic etching also removes the sacrificial layer 66. Thus, the process used to form the etch mask compensates for variation in the dimension F of the via 68, as described above with reference to FIG. 8, and further explained with reference to FIGS. 19 and 20, below.

Next, another etching process etches through the separation layer 46 to a top surface 81 of the contact 42 to create a bottom electrode opening 80. The bottom electrode opening 80 is etched using anisotropic etching that aligns with the mask 77a.

Figure 11:
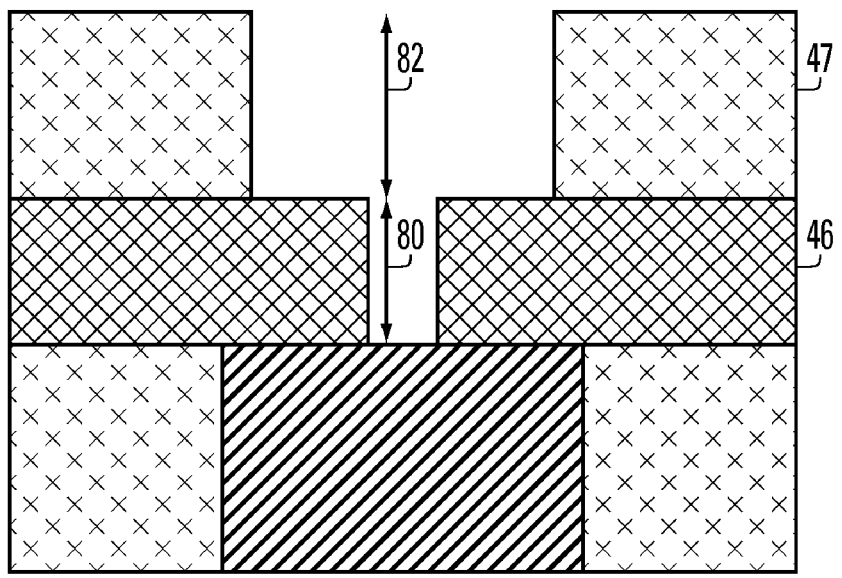

In FIG. 11, the mask 77a is removed by an etching process, such as a wet etching using KOH or TMAH, to reopen the via, creating memory cell opening 82 within the patterning layer 47, with the self-aligned bottom electrode opening 80 that is essentially centered within the memory cell opening 82.

Figure 12:
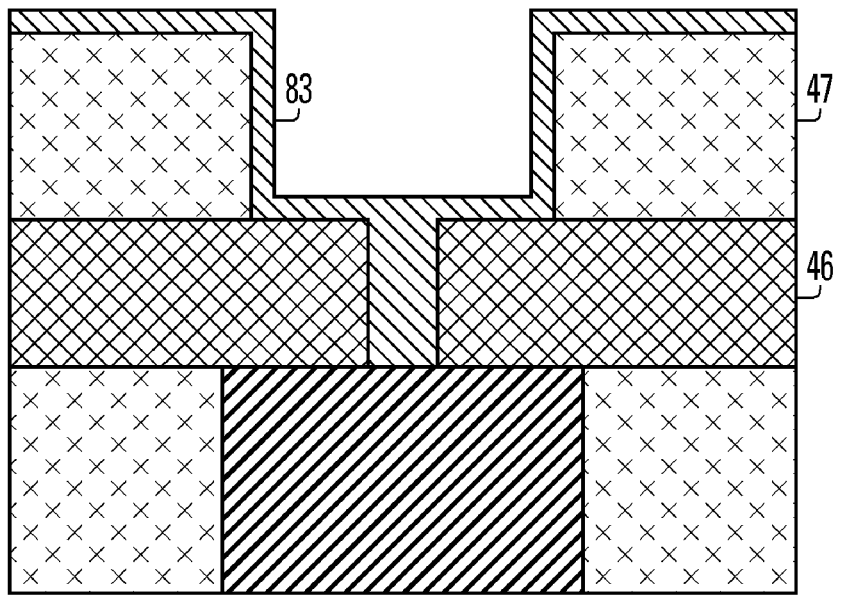

As illustrated in FIG. 12, an electrode material layer 83 is then deposited, by chemical vapor deposition for example, on the structure of FIG. 11 to fill the bottom electrode opening 80, forming bottom electrode 84, and leaving a layer of electrode material over a portion of the top surface of the lower, separation layer 46 within the memory cell opening 82, along the inner sidewall of the memory cell opening 82, and over a portion of top surface of the patterning layer 47.

It is preferred that all or part of the portions of bottom electrode contacting the memory material member comprise an electrode material, such as TiN, or another conductor selected for compatibility with the phase change material. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. TiN may be preferred because it makes good contact with GST (discussed above) as the memory material member, it is a common material used in semiconductor manufacturing, and it provides a good diffusion barrier at the higher temperatures at which GST transitions, typically in the 600-700° C. range.

Figure 13:
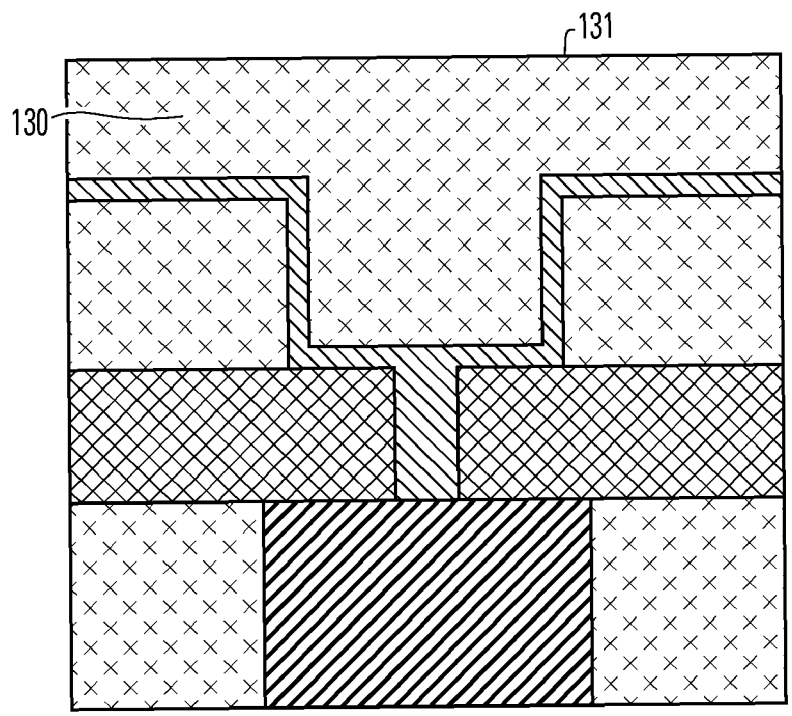

FIG. 13 illustrates a next stage in the process, in which the memory cell opening 82 is filled by spin-on coating 130 for example, to form a more planar top surface 131, in preparation for chemical mechanical polishing.

Figure 14:
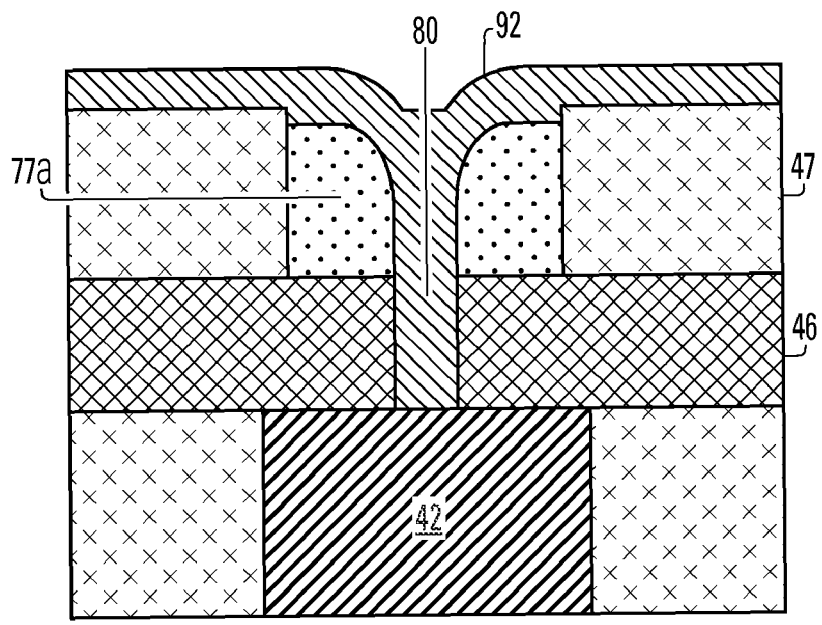
FIG. 14 illustrates an alternative process to replace the process of FIGS. 11-13 in a fabrication sequence for an array of programmable resistance memory cells.

FIG. 14 illustrates an alternative to the sequence of FIGS. 11-13, in which the electrode material 92 is deposited before removal of the etch mask 77a, covering the structure and filling the bottom electrode opening 80 to form bottom electrode 84. The resulting structure may be planar enough for chemical mechanical polishing at this stage without requiring a spin-on fill step.

Figure 15:
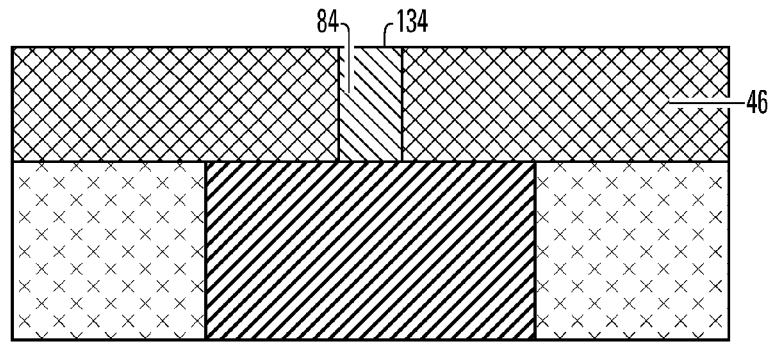
FIGS. 15-18 illustrate further stages in a fabrication sequence for an array of programmable resistance memory cells.

FIG. 15 illustrates a next stage in the process, after chemical mechanical polishing, of either the structure of FIG. 13 or the structure of FIG. 14 to expose top surface 134 of bottom electrode 84 in the array of bottom electrodes. The polishing step, or other planarizing etch, removes the patterning layer and the etch masks, and stops at or in the separation layer, leaving a top surface of the bottom electrode pillars exposed.

Figure 16:
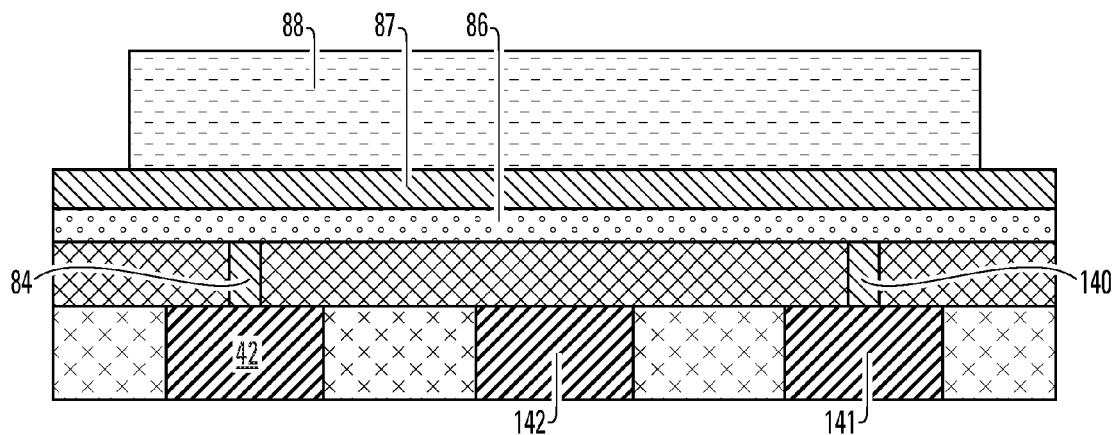

FIG. 16 illustrates a next stage in the process, with an expanded cross-section showing two bottom electrodes 84, 140 in an array of bottom electrodes over and in contact with corresponding contact structures, such as contacts 42, 141 in an array of contacts in the substrate. Also shown is a metal ground line 142 which is coupled to ground contacts in the access circuitry as discussed above in connection with FIG. 4. After planarizing as shown in FIG. 15, a layer 86 of memory material, such as GST, is deposited in a blanket deposit over the array of bottom electrodes. Next, a layer 87 of top electrode material is deposited over the layer 86 of memory material. The top electrode material may be the same material as used for the bottom electrode, including the materials discussed above, or may be a different material chosen for its suitability for use with the selected memory material and other parameters. A lithographic step forms masks 88, such as photoresist masks in a pattern over the array of contacts to define the memory elements. In this example, the mask 88 defines a rectangular patch extending across the field extending from to the left of bottom electrode 84 to the right of bottom electrode 140, across the ground line 142.

Figure 17:
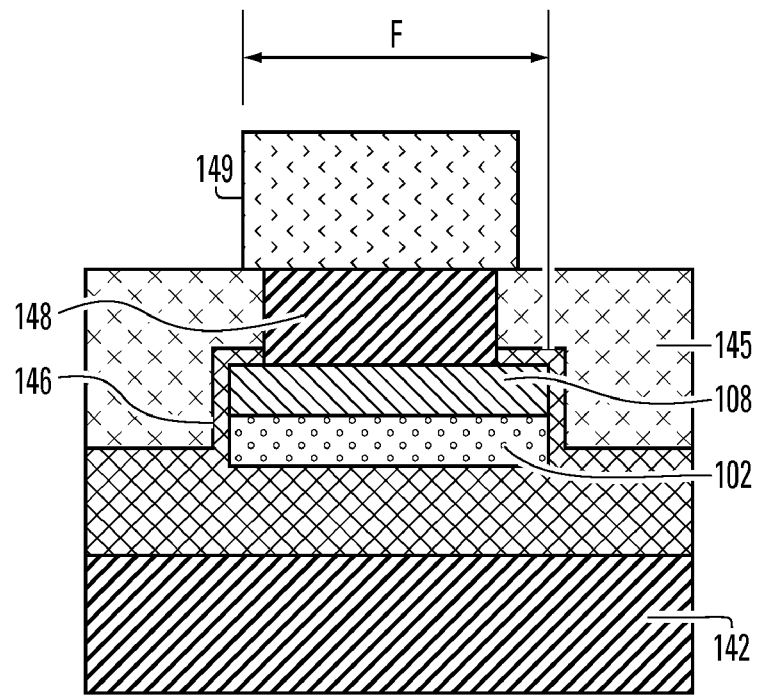

FIG. 17 is a cross-section taken through a memory element over the source line 142 and parallel with the source line, a view orthogonal to that of FIG. 16, illustrating a following stage. After etching the layers 87, 86 of top electrode material and memory material according to the pattern defined by the mask 88 desired to define memory elements including a rectangular patch of memory material 102 and top electrode material 108, and removing the mask 88, an array of memory cells is provided. As illustrated, a cap layer 146 is formed over the patches of memory material 102 and top electrode material 108, consisting of silicon nitride in this embodiment, protectively sealing sides the memory material 102 in the elements. Then, an interlayer dielectric fill 147 is applied, and planarized using chemical mechanical polishing CMP for example. Top electrode contact vias are formed through the interlayer dielectric 145, and filled with contact material such as tungsten or copper to form top contacts 148. The location of the top contact for a memory element is positioned between the bottom electrodes over the source line 142 in this embodiment, allowing for sharing of a top contact 148 between two adjacent memory cells. The resulting structure is then covered by a metal layer that is patterned to define bit lines 149.

Figure 18:
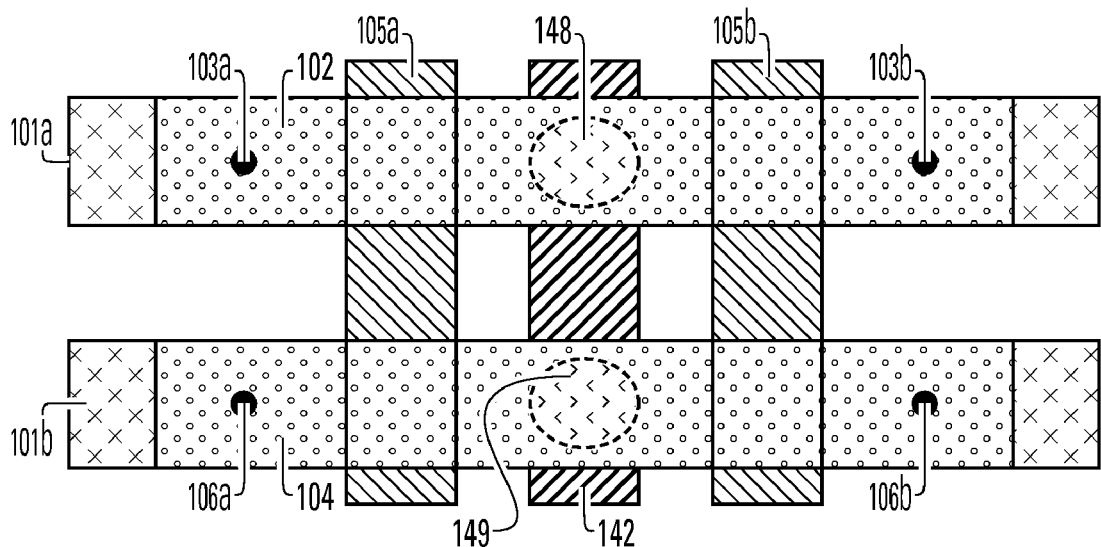

FIG. 18 illustrates the layout of an array having a pattern defined in FIGS. 16 and 17. Word lines 105a, 105b run parallel to a source line 107 in the substrate. Bottom electrodes 103a, 103b, 106a, 106b extend to the drain terminals of transistors controlled by the word lines 105a and 105b. The memory element 102 extends across the tops of bottom electrodes 103a and 103b. Top electrode contact 148 extends between the top electrode layer over memory element 102 to the bit line 101a. Likewise, a memory element 104 extends across the tops of bottom electrodes 106a and 106b. Top electrode contact 149 extends between the top electrode layer over memory element 104 to the bit line 101b. Metal bit lines 101a and 101b overlie the memory elements and extend in a direction orthogonal to the word lines.

The widths of the memory elements 102a and 102b in this process are determined by the lithographic and etch processes described with respect to FIG. 16, which result in the dimension F shown in FIG. 17. Thus, the width of the memory members will vary across the array by at least ΔF, as discussed above, and is substantially wider than the diameter (or width) of the bottom electrodes 103a, 103b, 106a, 106b. This variation in the width of the memory elements within the memory cell has little effect on the set and reset characteristics of the cell, because the active region is determined to a much greater degree by the area of the contact with the bottom electrode.

Figure 19:
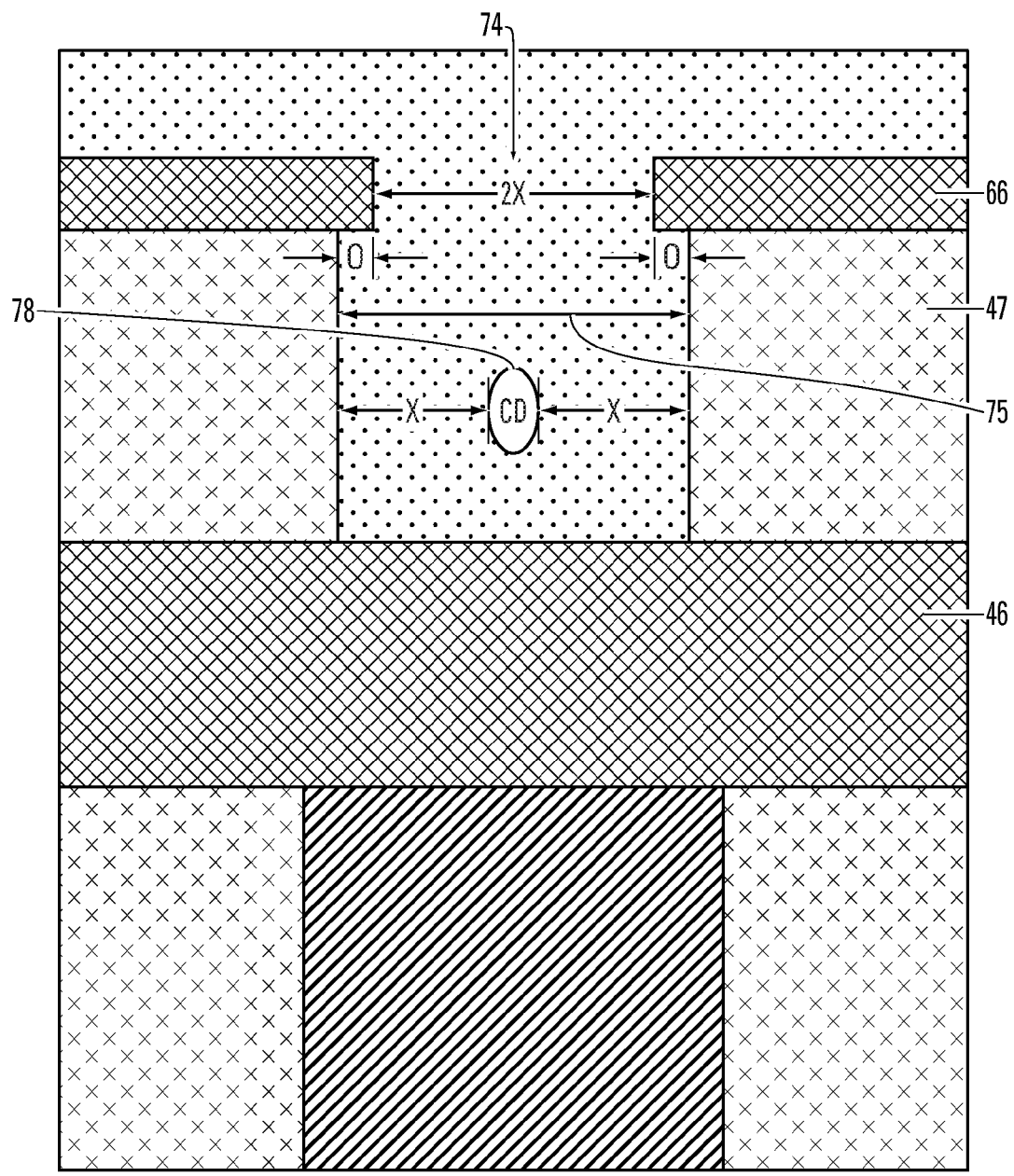
FIG. 19 illustrates the compensation for variation in the sizes of features made using the lithographic process in formation of the critical dimension etch mask for the methods described herein.

FIG. 19 is an expanded view of FIG. 8, referred to herein for the purpose of illustrating the self-converged nature of the process. A critical dimension of the memory cell structure is the area of contact between the bottom electrode and the memory material. In this process, this critical dimension is determined by the diameter of the bottom electrode opening 80 formed using the etch mask 77a, shown in FIG. 9. In turn, the diameter of the etch mask 77a is determined by the size of the void 78 shown in FIG. 19. The size CD of the void is determined in this process by the overhang dimension O, formed (in one embodiment) by selective etching of the patterning layer 47 to undercut the sacrificial layer 66. In the illustration, the dimension 2× is equal to the dimension F labelled in FIG. 6, and varies over a range equal to F+ΔF, as discussed above. The dimension O also varies by a range of O+ΔO. Because the undercut etch can be controlled sufficiently that ΔO is much less than ΔF, and is essentially independent of the variations in F, the process of forming the void compensates for the variation in F.

The manner in which the process compensates for variations in F can be understood as follows. The fill material is deposited using a substantially conformal deposition process, so that it is deposited on the sidewalls within the lower opening segment 73L in FIG. 7 through the patterning layer at about the same rate as it is deposited on the sidewalls within the upper opening segment 73U in FIG. 7, through the sacrificial layer. Thus, when the thickness X of the fill material reaches one half the width (2X=F+ΔF) of the opening in the sacrificial layer, there remains a void 78 between the sidewalls of fill material growing on the patterning layer. Since the opening is closed at the top, no more growth is possible within the lower opening segment 73L through patterning layer, and the void 78 is established. The fill deposition process is executed so that the openings in all cells are closed, and therefore the thickness X of the deposited material at which the top is closed varies with the variations in F. However, the size CD of the voids in all the cells remains equal to 2(O+ΔO), independent of and compensating for variations in F. The patterning layer used to form the mask opening is removed in the examples described herein. However, the dimension F shown in FIG. 17 for the width of the memory element is similar to the dimension F for via 68 defined using the etch mask 67 shown in FIG. 5. Thus, the memory element width F will vary across the array as determined by variations in the lithographic and etch processes used to form it. The critical dimension of the top surface of the bottom electrode, in devices made as described here, will vary over a much smaller range than the width of the memory cell, for the same reason that the size of the opening in the etch mask varies over a much smaller range than the mask opening.

Figure 20:
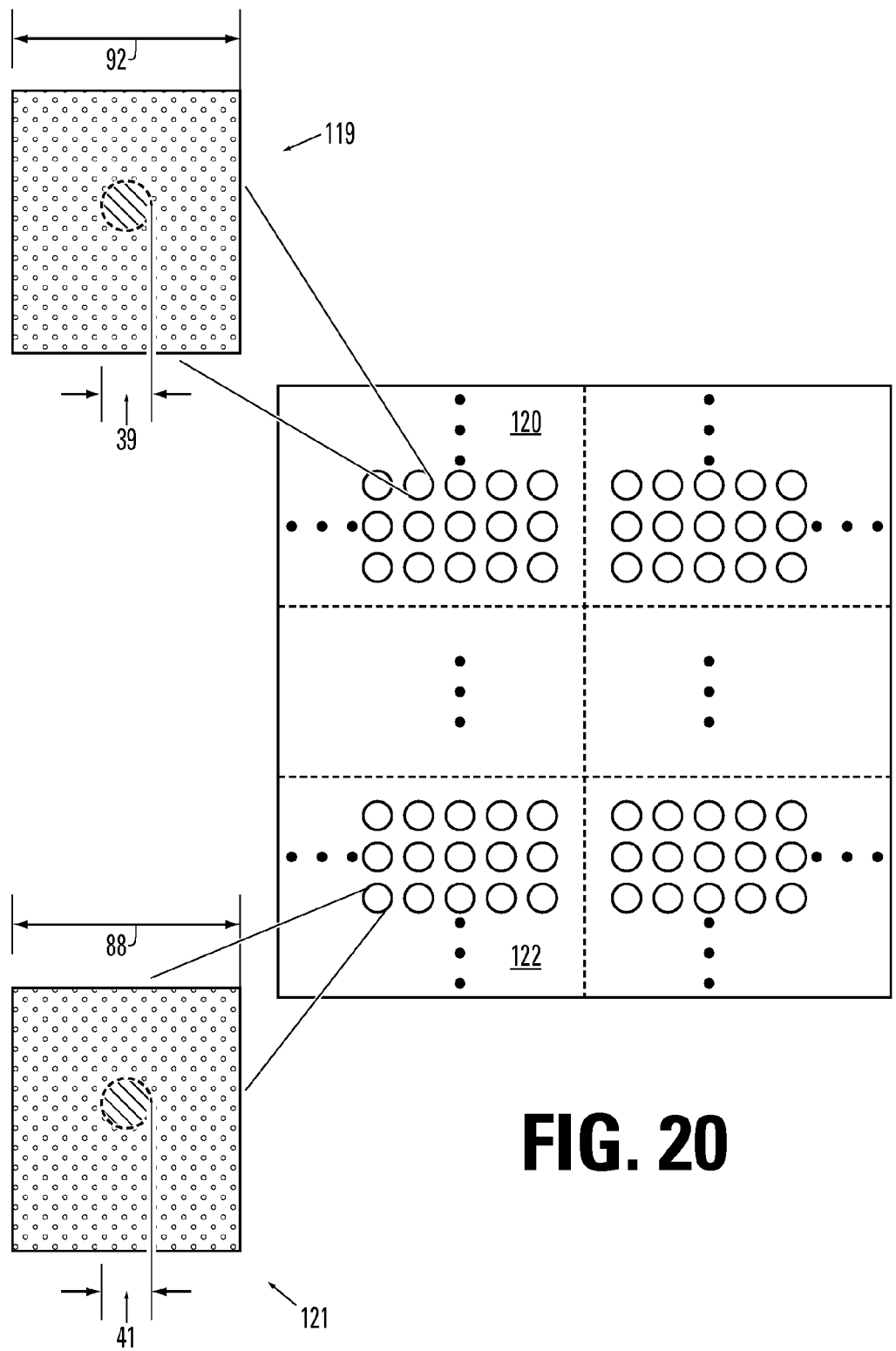
FIG. 20 is a heuristic diagram of a memory array illustrating variations in critical dimension among the selected memory cells.

FIG. 20 is a heuristic diagram of a memory device comprising an array of memory cells, illustrating a feature of an array of memory cells made as described herein. In particular, an array including millions of cells covers a relatively large area on a device, over which the lithographically formed memory elements will vary in size over a range ΔF, as discussed above. Therefore, if one samples a memory cell 119 in a first sector 120 of the array, and compares that cell with a memory cell 121 is a second sector 122 of the array, it is likely that the width of the memory element will differ by as much as ΔF. However, the width of the surface of the bottom electrode in contact with the memory element, in embodiments of the present invention will vary by at most 2ΔO.

For example, using a lithographic processing having a 90 nm feature size, varying by 5% across the array, the width F of a memory element vary within a range having an extent of about 4.5 nm across an array. The overhang dimension 76, determined by the undercut etch process or by the overhang growth process, may also vary across an array by 5%. As explained above, in order to make a 40 nm CD, the overhang dimension 76 should be 20 nm. If the process creating the overhang results in a variation of 5%, then the overhang dimension O should vary within a range having an extent of about 1 nm on each side. This would result in a variation in CD within a range having an extent of about 2 nm for the nominally 40 nm hole across an array, or 5%. This 2 nm variation is substantially less than the variation in the lithographic dimension F. In contrast, prior art side wall spacer techniques that do not compensate for lithographic variations would result in a 4.5 nm variation across the array for the nominally 40 nm hole, or 11.25%. The self-converging process described herein substantially narrows the distribution of CD across the array, to ranges having extents much less than 4.5 nm, including less than 3 nm, a distribution not possible in the prior art.

Thus, for an illustrative example in which the dimension F is assumed to vary across the specified range of about 5% for nominally F=90 nm and the dimension CD is assumed to vary across a range of about 5% for nominally CD=40 nm, the cell 119 may have a width of dimension F of about 92 nm and a dimension CD of about 19 nm, while the cell 121 may have a width of dimension F of about 88 nm, and a dimension CD of about 21 nm. Thus, a novel structure results in which the width of the memory element in cell 119 as measured varies from width of the memory element in cell 121 by 4/92, or 4.3% of the width F in cell 119, in the example illustrated. However, the width of the critical dimension in cell 119 varies from that in cell 121 by 2/92, or 2.2% of the width F in cell 119. Therefore the critical dimensions of the sampled memory cells vary by less than the variations in the width of the memory elements in a way not possible in the prior art.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the disclosure and the scope of the following claims.

What is claimed is:

1. A method for manufacturing an array of memory cells, comprising:
   forming a separation layer on a substrate having an array of contacts;
   forming a patterning layer on the separation layer over the array of contacts, the patterning layer including material having etching characteristics different than the separation layer;
   forming a sacrificial layer over the patterning layer;
   forming an array of mask openings in the patterning layer over the array of contacts using a patterning process, said forming an array of mask openings includes forming upper opening segments within the sacrificial layer, and lower opening segments within the patterning layer, the upper and lower opening segments having first and second widths, the sacrificial layer having overhanging portions extending into the openings so that the first widths are less than the second widths;
   depositing a fill material in the mask openings in the array of mask openings by a process causing formation of voids within the lower opening segments, the voids having widths determined by the difference between the first and second widths; and
   anisotropically etching the fill material to open the voids and then continuing to anisotropically etch the fill material to expose the separation layer in areas over corresponding contacts in the array of contacts, the areas having widths substantially equal to the widths of the voids, and stopping the etching on or within the separation layer, leaving sidewalls of fill material on the sides of the lower opening segments defining etch masks within the mask openings;
   etching through the separation layer using the etch masks to define an array of electrode openings exposing corresponding contacts in the array of contacts;
   depositing electrode material in the electrode openings to form an array of bottom electrodes contacting corresponding contacts in the array of contacts;
   forming memory elements over and in contact with bottom electrodes within the array of bottom electrodes, the memory elements comprising programmable resistance material; and
   forming top electrodes in contact with the memory elements.

2. The method of claim 1, including removing the sacrificial layer during said etching through the separation layer.

3. The method of claim 1 wherein said forming memory elements and said forming top electrodes includes:
   forming a layer of programmable resistance material over the array of bottom electrodes;

forming a layer of electrode material over and in contact with the layer of programmable resistance material;

patterning the layer of electrode material and the layer of programmable resistance material to form said memory elements with top electrodes; and forming bit lines over and in contact with the top electrodes.

4. The method of claim 3 including:

forming a cap layer over the memory elements, after said patterning to seal the programmable resistance material;

filling over the cap layer and over the memory elements with a dielectric fill process; and providing contacts through the dielectric fill between the memory elements and the bit lines.

5. The method of claim 1, wherein the fill material consists essentially of silicon.

6. The method of claim 1, wherein the separation layer comprises silicon nitride and the patterning layer comprises silicon dioxide.

7. The method of claim 1, wherein the array of bottom electrodes has respective surfaces in contact with the programmable resistance material that are less than 30 nanometers wide.

8. The method of claim 1, wherein the programmable resistance material comprises a chalcogenide.

9. The method of claim 1, wherein the programmable resistance material has at least two solid phases which are reversibly inducible by a current, the two solid phases being a generally amorphous phase and a generally crystalline phase.

10. The method of claim 1, wherein forming the memory elements comprises:

removing the patterning layer and the etch masks, and forming a top surface of the separation layer;

etching the electrode material so that the bottom electrodes have top surfaces aligned with the top surface of the separation layer; and forming the memory elements on the exposed top surface of the separation layer.

11. The method of claim 10, wherein removing the patterning layer and the etch masks and the etching the electrode material comprises performing a planarizing process.

* * * * *